United States Patent
Zhang et al.

(10) Patent No.: US 10,784,957 B2
(45) Date of Patent: Sep. 22, 2020

(54) METHOD AND DEVICE FOR CONTROLLING WAVELENGTH OF LIGHT EMITTING ASSEMBLY

(71) Applicant: Accelink Technologies Co., Ltd., Wuhan, Hubei (CN)

(72) Inventors: Yuan Zhang, Wuhan (CN); Hongchun Xu, Wuhan (CN); Fei Liang, Wuhan (CN); Lu Guo, Wuhan (CN)

(73) Assignee: Accelink Technologies Co., Ltd. (CN)

( * ) Notice: Subject to any disclaimer, the term of this patent is extended or adjusted under 35 U.S.C. 154(b) by 0 days.

(21) Appl. No.: 16/473,109

(22) PCT Filed: Dec. 27, 2016

(86) PCT No.: PCT/CN2016/112318
§ 371 (c)(1),
(2) Date: Jun. 24, 2019

(87) PCT Pub. No.: WO2018/119637
PCT Pub. Date: Jul. 5, 2018

(65) Prior Publication Data
US 2019/0349080 A1     Nov. 14, 2019

(30) Foreign Application Priority Data

Dec. 26, 2016   (CN) .......................... 2016 1 1221203

(51) Int. Cl.
*H04B 10/572*  (2013.01)
*H04B 10/032*  (2013.01)
(Continued)

(52) U.S. Cl.
CPC ........ *H04B 10/032* (2013.01); *H03M 1/1205* (2013.01); *H04B 10/0775* (2013.01);
(Continued)

(58) Field of Classification Search
CPC .................................................... H04B 10/572
See application file for complete search history.

(56) References Cited

U.S. PATENT DOCUMENTS 9,553,663 B1 *   1/2017  Rope ...................... H04B 10/40
2002/0121094 A1 *  9/2002  VanHoudt ............... F25B 21/04
                                                    62/3.3
(Continued)

FOREIGN PATENT DOCUMENTS

CN          101174758 A       5/2008
CN          203277961 U      11/2013
(Continued)

OTHER PUBLICATIONS

Data Sheet of Thermoelectric Cooler (TEC) Controller ADN8831, Analog Devices, 2012.*
International Search Report for Application No. PCT/CN2016/112318, dated Sep. 28, 2017.

*Primary Examiner* — Shi K Li
(74) *Attorney, Agent, or Firm* — Lerner, David, Littenberg, Krumholz & Mentlik, LLP

(57) ABSTRACT

A method and device for controlling a wavelength of a light emitting assembly. The device comprises a microcontroller, a light emitting assembly temperature control unit, an analog-to-digital converter, a digital-to-analog converter, a storage unit, a thermistor of a negative temperature coefficient in a TOSA component, and a TEC assembly. The microcontroller comprises an ADC input interface, a DAC output interface, a GPIO output interface, an external communication interface, and a memory interface. The light emitting assembly temperature control unit comprises a turn-off enable control circuit, a temperature detecting circuit, an error amplification-comparison-compensation unit, a TEC voltage/current limitation circuit, a TEC voltage/current detecting circuit, and a TEC differential voltage driver. The method and device are simple and flexible, implements a (Continued)

precise control of the wavelength, and also considers an adjustment function of the wavelength.

17 Claims, 5 Drawing Sheets

(51) Int. Cl.
*H03M 1/12* (2006.01)
*H04B 10/077* (2013.01)
*H04B 10/50* (2013.01)
*H04Q 11/00* (2006.01)

(52) U.S. Cl.
CPC ....... *H04B 10/0779* (2013.01); *H04B 10/503* (2013.01); *H04Q 11/0062* (2013.01); *H04Q 2011/0083* (2013.01)

(56) References Cited

U.S. PATENT DOCUMENTS

| | | | |
|---|---|---|---|
| 2005/0078957 A1* | 4/2005 | Hendow | G01J 3/36 398/33 |
| 2007/0019966 A1* | 1/2007 | Chiu | H04B 10/40 398/155 |
| 2008/0310851 A1 | 12/2008 | Ichino | |
| 2009/0010655 A1* | 1/2009 | Schulz | H01S 5/02415 398/136 |
| 2015/0162989 A1 | 6/2015 | Oomori | |

FOREIGN PATENT DOCUMENTS

| | | |
|---|---|---|
| CN | 105680296 A | 6/2016 |
| CN | 106656347 A | 5/2017 |

* cited by examiner

METHOD AND DEVICE FOR CONTROLLING WAVELENGTH OF LIGHT EMITTING ASSEMBLY

CROSS REFERENCE TO RELATED APPLICATIONS

The present application is a national phase entry under 35 U.S.C. § 371 of International Application PCT/CN2016/112318 filed Dec. 27, 2016, published in China, which claims priority from CN2016/11221203.9 filed Dec. 26, 2016, all of which are incorporated herein by reference.

TECHNICAL FIELD OF THE DISCLOSURE

The present disclosure relates to an optical communication device, and specifically to a light emitting assembly, in particularly to a method and device for controlling a wavelength of a light emitting assembly.

BACKGROUND

As the communication rate of a fiber optic network is increasingly higher, the bandwidth requirement for an optoelectronic device, such as a laser and a photodiode, are increasingly higher, but a variety of multiplexing techniques are emerging since the bandwidth of a single optoelectronic device is not sufficient to support a fiber network communication rate under the prior art conditions, where a wavelength division multiplexing technique is a solution which is relatively economical and easy to implement.

Typically, an optical signal is generated internally by a laser within a transmitter optical subassembly (TOSA) in an optoelectronic transceiver module or an optoelectronic transmitter module. As the transmission rate increases and the module size is smaller, two or more lasers with different wavelengths are integrated within a single TOSA to become mainstream, and these lasers with different wavelengths are synthesized into a beam of light passing through the optical wavelength division multiplexer, and then transmitted on an optical fiber.

Wherein the above mentioned laser typically is consisted of a light emitting diode (LED) or a distributed feedback (DFB) laser, and typically a change in temperature affects an output central wavelength of the LED or DFB laser, further as the temperature increases, the effective output power of the laser reduces, and the wavelength tuning range of the single laser will be limited. In a TOSA composed of multiple lasers, different central wavelengths of a laser suffer from differences in temperature plus differences of the passband ranges of the wavelength division multiplexer, and how to accurately and flexibly control the output wavelength of the laser to match the wavelength division multiplexer becomes a problem.

Typically, a thermoelectric cooler (TEC) is used within a TOSA device to control the temperature of the LED or DFB laser. By controlling a current direction of the TEC, heating or cooling of the laser is achieved, so that the purpose of the constant temperature control laser is achieved. In an existing TOSA temperature control system, a switching circuit is generally used to control the current applied across the TEC, and the switching circuit has the characteristics of being simple in structure and easy to operate, but the switching circuit has problems of a large temperature fluctuation and that the temperature cannot be stabilized at a set value. These problems may result in changes in the wavelength of the laser, and the changes in the wavelength can cause variations in output optical power of a TOSA assembly comprising the multiple lasers and the wavelength division multiplexer, even cause light of some wavelength not to be transmitted at a larger change of the wavelength, which would directly cause error rate of the optical transmission system to increase and directly affect performance of the optical transmission system.

Therefore, an automatic temperature control method or device used by a laser in the light emitting assembly is researched to flexibly control the wavelength of the light emitting assembly, which has practical application value.

SUMMARY

The present disclosure directs to provide an automatic temperature control circuit for controlling a wavelength of a light emitting assembly, which meets a requirement that an optical transmission system is stable in wavelength and a central wavelength is matched with an optical multiplexer, and meanwhile a microcontroller can flexibly control a temperature range of a TEC to flexibly adapt different requirements of the TOSA device to control the temperature.

In order to achieve the above objects, the technical problem of the present disclosure is solved by a following technical solution. The present disclosure provides a device for controlling a wavelength of a light emitting assembly comprising a microcontroller, a light emitting assembly temperature control unit, an analog-to-digital converter (ADC), a digital-to-analog converter (DAC), and a storage unit, wherein the microcontroller includes an ADC input interface connected to the analog-to-digital converter, a DAC output interface connected to the digital-to-analog converter, an external communication interface, and a memory interface connected to the storage unit;

wherein the light emitting assembly temperature control unit is connected to a thermistor and a thermoelectric cooler both disposed in the light emitting assembly, and the light emitting assembly temperature control unit detects a current temperature of the light emitting assembly by the thermistor, and detects a current voltage/current of the thermoelectric cooler, and inputs the detected current temperature and current voltage/current to the microcontroller through the analog-to-digital converter, and receives, by the digital-to-analog converter, a temperature control target set by the microcontroller;

wherein the light emitting assembly temperature control unit calculates, by a PID control algorithm, a voltage/current to be applied on the thermoelectric cooler to control the temperature of the light emitting assembly on the basis of the detected current temperature of the light emitting assembly, the detected current voltage/current of the thermoelectric cooler, and the temperature control target set by the microcontroller.

In the above technical solution, the light emitting assembly temperature control unit includes a temperature detecting circuit, an error amplification-comparison-compensation unit, a TEC differential voltage driver, a TEC voltage/current detecting circuit, and a TEC voltage/current limiting circuit;

wherein the temperature detecting circuit is connected to the thermistor disposed in the light emitting assembly, to detect a feedback voltage $V_{FB}$ linearly related to the current temperature of the light emitting assembly and to transmit the same to the analog-to-digital converter and the error amplification-comparison-compensation unit;

wherein the error amplification-comparison-compensation unit receives a set voltage $V_{TEMPSET}$ set by the microcontroller, linearly related to the temperature control target, generates an error voltage linearly related to a difference between the feedback voltage $V_{FB}$ and the set voltage $V_{TEMPSET}$, based on the feedback voltage $V_{FB}$ and the set voltage $V_{TEMPSET}$, and outputs the error voltage to the TEC differential voltage driver;

wherein the TEC differential voltage driver outputs a differential driving voltage based on the error voltage, the differential driving voltage drives the thermoelectric cooler of the light emitting assembly to heat or cool the light emitting assembly;

wherein the TEC voltage/current detecting circuit is connected to the thermoelectric cooler of the light emitting assembly, detects the current voltage/current of the thermoelectric cooler, and inputs the same to the microcontroller through the analog-to-digital converter, and provides feedback to the TEC differential voltage driver through the TEC voltage/current limiting circuit to avoid overloading the thermoelectric cooler.

In the above technical solution, the error amplification-comparison-compensation unit comprises a first operational amplifier OP1 and a second operational amplifier OP2;

wherein the first operational amplifier OP1 receives the feedback voltage $V_{FB}$ and converts or regulates the same to a linear voltage $V_{TEMPOUT}$ to be output to the second operational amplifier OP2;

wherein the second operational amplifier OP2 establishes a hardware PID compensation network together with separate resistive and capacitive elements, and generates an error voltage that is linear with a difference between the linear voltage $V_{TEMPOUT}$ and the set voltage $V_{TEMPSET}$, according to the linear voltage $V_{TEMPOUT}$ and the set voltage $V_{TEMPSET}$.

In the above technical solution, the error amplification-comparison-compensation unit performs a PID operation control by a software to generate the error voltage that is linear with the difference between the feedback voltage $V_{FB}$ and the set voltage $V_{TEMPSET}$.

In the above technical solution, the light emitting assembly temperature control unit further includes a turn-off enable control circuit; and the microcontroller is connected to the turn-off enable control circuit through a GPIO output interface to control a working state of the TEC differential voltage driver.

In the above technical solution, the TEC differential voltage driver operates in a linear power mode, or a switched mode, or a hydride mode.

A device for controlling a wavelength of the light emitting assembly provided by the present disclosure controls the temperature of the light emitting assembly, thereby controlling a central wavelength of an optical signal emitted by the light emitting assembly.

The present disclosure further provides a method for controlling a wavelength of a light emitting assembly, performing a PID feedback control to a central wavelength of an optical signal emitted by the light emitting assembly.

The present disclosure further provides a calibration system comprising a host HOST, a unit to be calibrated, an optical fiber, and a wavelength monitor, wherein the unit to be calibrated includes the above device for controlling a wavelength of a light emitting assembly, a light emitting assembly control unit, and a light emitting assembly;

The host HOST is connected to the unit to be calibrated and the wavelength monitor, and the host HOST issues a calibration command to the microcontroller in the unit to be calibrated, and the microcontroller sets the light emitting assembly control unit, and the light emitting assembly control unit drives light emitted by the light emitting assembly to enter the wavelength monitor through the optical fiber, and the wavelength monitor monitors a central wavelength of the light emitted by the light emitting assembly.

In the above technical solution, a calibration data table generated by the calibration system is written into the storage unit through an external communication interface of the microcontroller; the microcontroller determines a relevant parameter of a target temperature according to the calibration data table; the calibration data table includes a relationship among an analog-to-digital converter sampling temperature input voltage, a temperature of the light emitting assembly, a central wavelength of the light emitting assembly, and an output voltage output by the digital-to-analog converter.

The present invention achieves the following technical effects:

According to the method and device for controlling the wavelength of the light emitting assembly, the control precision and accuracy of the internal temperature of the light emitting assembly are improved, the precise control of the wavelength is realized, and the wavelength adjusting function is considered. In addition, the device according to the present disclosure has a maximum TEC voltage, current limiting function which can effectively protect the safety of a TEC assembly, and the TEC assembly is prevented from being damaged. The TEC voltage, current detection function can effectively detect the working performance of the TEC, the turn-off enable control function can flexibly turn off the opened TEC control according to the actual state change, and therefore the device also has strong fault diagnosis and fault protection function.

DETAILED DESCRIPTION

The present invention will be further described in detail below in conjunction with the drawings and specific embodiments, in order to facilitate the understanding and implementation of the present disclosure by those skilled in the art.

Embodiment 1

Figure 1:
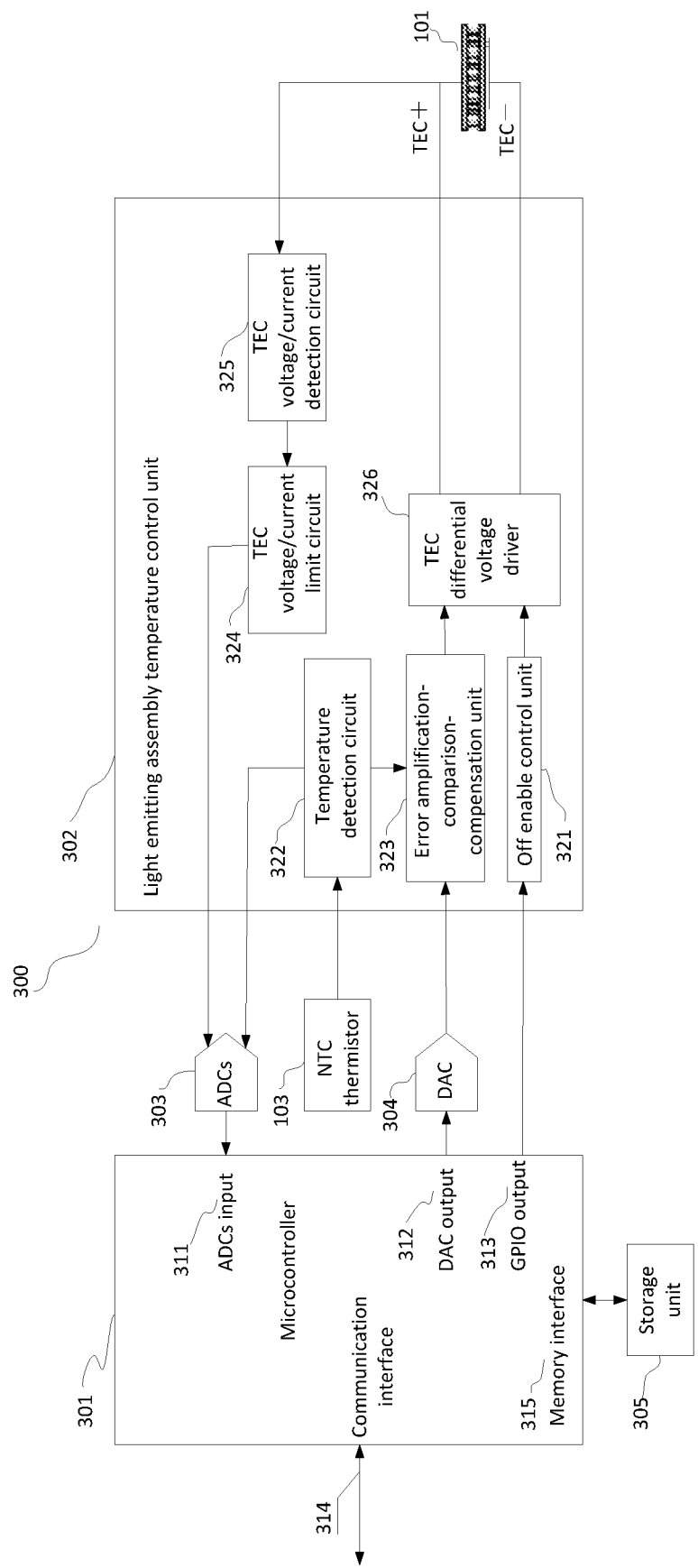
FIG. 1 shows a principle block diagram of a method and device for controlling a wavelength of a light emitting assembly according to the present disclosure.

FIG. 1 shows the principles of a method and device for controlling a wavelength of a light emitting assembly according to the present disclosure. The device 300 for controlling a wavelength of a light emitting assembly comprises a microcontroller 301, a light emitting assembly temperature control unit 302, an analog-to-digital converter (ADC) 303, a digital-to-analog converter (DAC) 304, a storage unit 305, a thermistor 103 inside a TOSA device with a negative temperature coefficient (NTC), and a TEC assembly 101.

Wherein the microcontroller 301 also includes an ADC input interface 311, a DAC output interface 312, a GPIO output interface 313, a peripheral communication interface 314, and a memory interface 315.

The light emitting assembly temperature control unit 302 includes a turn-off enable control circuit 321, a temperature detecting circuit 322, an error amplification-comparison-compensation unit 323, a TEC voltage/current limiting circuit 324, a TEC voltage/current detecting circuit 325, a TEC differential voltage driver 326.

The microcontroller 301 sends and receives data or commands from an external host through an external communication interface 314 which includes, but is not limited to, I2C, MDIO, or UART. For example, the microcontroller 301 receives a command to set a light emitting assembly target temperature to 50° C., and the microcontroller 301 will find a DAC LSB value corresponding to 50° C. according to a corresponding table between the digital-to-analog converter 304 LSB output voltage and the temperature, the microcontroller 301 would then set this value to the DAC 304 through the DAC output interface 312 while the microcontroller 301 controls the turn-off enable control circuit 321 to turn on through the GPIO output interface 313. After the turn-off enable control circuit 321 turns on, the light emitting assembly temperature control unit 302 enters a normal operation mode, at this time, the temperature detecting circuit 322 connected to the NTC thermistor 103 outputs a feedback voltage $V_{FB}$ on the temperature, the feedback voltage $V_{FB}$ enters the error amplification-comparison-compensation unit 323, and the $V_{FB}$ is connected to an ADC sampling channel.

There are two implementations of the error amplification-comparison-compensation unit 323.

Figure 7:
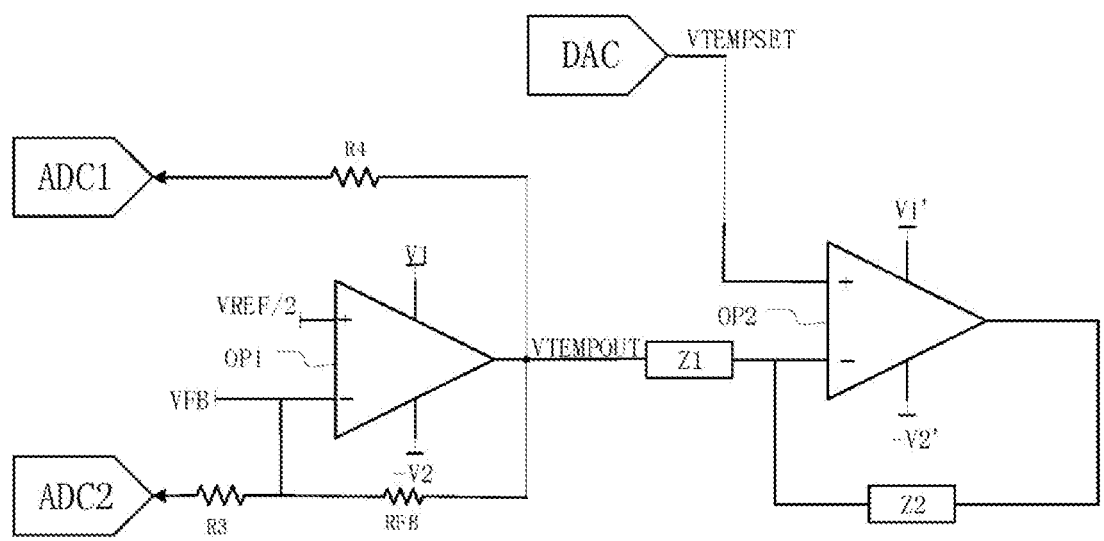
FIG. 7 shows a first implementation of the error amplification-comparison-compensation unit according to the present disclosure.
Figure 8:
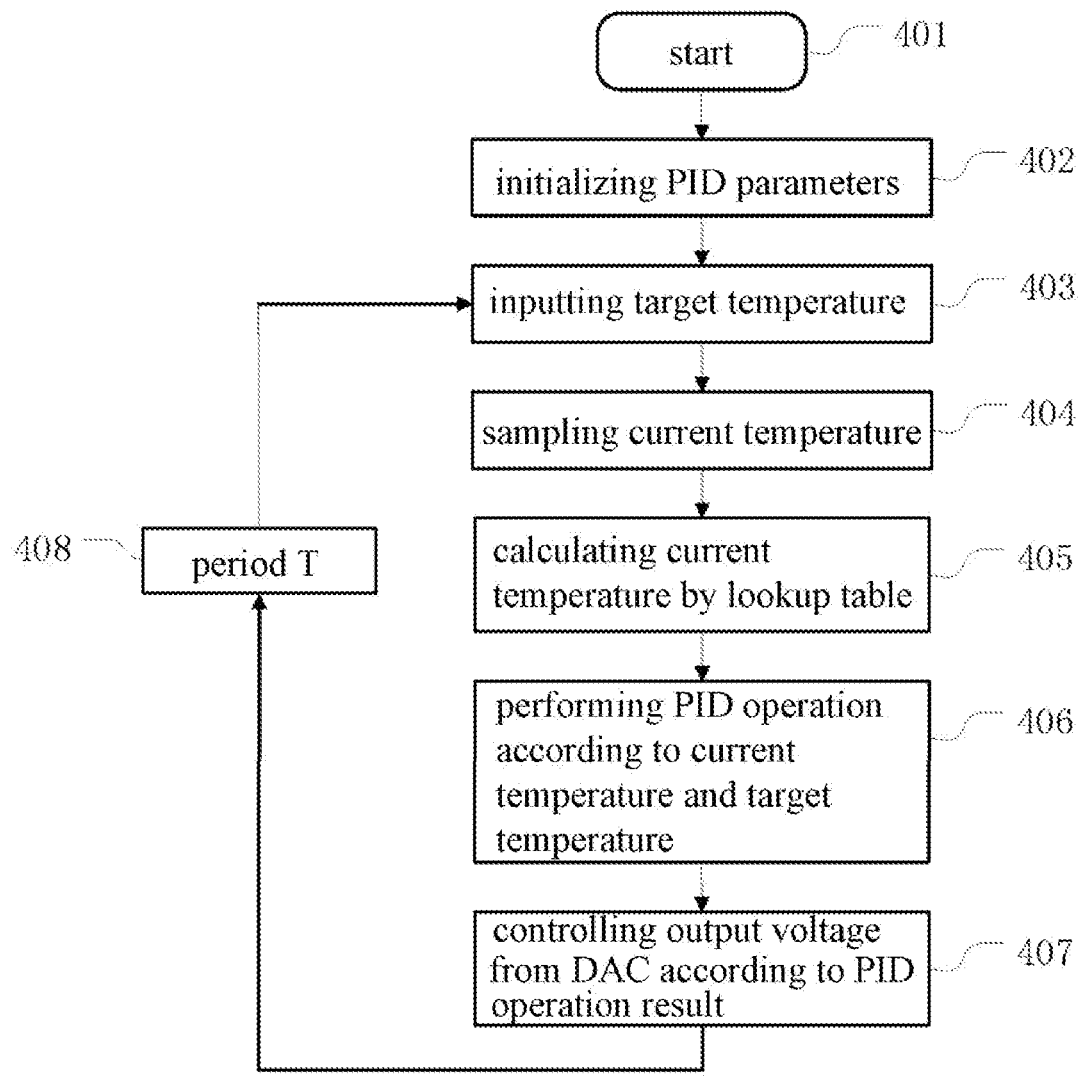
FIG. 8 shows a second implementation of the error amplification-comparison-compensation unit according to the present disclosure.

As shown in FIG. 7, the first implementation consists of two operational amplifiers, the first operational amplifier OP1 of which receives the feedback voltage $V_{FB}$, converts or adjusts the input to a linear voltage output which is a representative of the object temperature, while the voltage is fed into the second operational amplifier OP2, and is compared with a set voltage $V_{TEMPSET}$ set on the basis of the temperature output by DAC to produce an error voltage proportional to a difference of the two; and the second operational amplifier OP2 of which utilizes separate resistive and capacitive elements to construct a hardware PID compensation network which can rapidly adjust and stably control the set temperature; According to the second implementation, the current temperature is taken by the ADC 2 in FIG. 7, the microcontroller controls the output voltage output by the DAC according to a difference between the sampled current temperature and the target set temperature, through a proportion-integration-differentiation PID operation performed by a software, and the software realizes accurate control of the temperature through periodic sampling and calculating, whose realization principle is shown in FIG. 8.

Specific steps of the second implementation of the error amplification-comparison-compensation unit comprise:

Step 401, start;

Step 402, initializing PID parameters;

Step 403, inputting a target temperature;

Step 404, sampling a signal output by a temperature sensor to obtain a voltage value corresponding to a current temperature;

Step 405, calculating the current temperature according to the sampling voltage through a look-up table;

Step 406, performing a PID calculation according to the current temperature and the target temperature;

Step 407, controlling a voltage output by a DAC according to the PID operation result;

Step 408, waiting for a period T, and proceeding to step 403.

A voltage signal output by the error amplification-comparison-compensation unit 323 enters the TEC differential voltage driver 326, and the TEC differential voltage driver 326 regulates and outputs a differential voltage according to the voltage signal so that the current through the TEC assembly 101 can carry away heat of the object connected to the TEC, or smoothly become to an opposite polarity to heat the object. The TEC differential voltage driver 326 may operate in a linear power mode, a switched mode, or a hybrid mode.

Meanwhile, the TEC voltage/current limiting circuit 324 included in the light emitting assembly temperature control unit 302 locates between the TEC voltage/current detecting circuit 325 and the TEC differential voltage driver 326, and is used to receive a feedback signal of the TEC voltage/current detecting circuit 325, meanwhile generating a maximum output voltage and current that controls the TEC differential voltage driver 326 to avoid damaging the TEC assembly 101 due to excessive voltage or current applied to the TEC assembly.

An output signal from the TEC voltage/current detecting circuit 325 included in the light emitting assembly temperature control unit 302 respectively enters a TEC voltage detection ADC 303-1 (not shown in detail in the figure) and a TEC current detection ADC 303-2 (not shown in detail in the figure) in the analog-to-digital converter (ADC) 303, and then enters the microcontroller after the analog-to-digital conversion is performed by the TEC voltage detection ADC 303-1 and the TEC current detection ADC 303-2, further, the microcontroller calculates a control voltage applied to the TEC controller and a current through the TEC based on the sampled data.

The storage unit 305 is used to store non-volatile data, and may adopt a separate one or more electrically erasable programmable read-only memories (EEPROMs), or a separate one or more non-volatile memory FLASH, or a non-volatile memory FLASH integrated into the microcontroller.

Further, the non-volatile data stored by the storage unit 305 includes, but is not limited to, a corresponding table between NTC thermistor resistance and temperature, a corresponding table between ADC sampling temperature input voltage LSB and thermistor resistance, and a corresponding table between digital-to-analog converter LSB output voltage and temperature. A PID algorithm performed by the microcontroller is proportion, integration and differentiation for a constant.

The digital-to-analog converter may employ a single channel or a multi-channel DAC device, or a digital-to-analog converter integrated into the microcontroller.

Further, the resolution of the digital-to-analog converter is not lower than 8 bits.

The analog-to-digital converter may employ a separate, multiple single-channel or one multi-channel ADC device, or an analog-to-digital converter integrated into the microcontroller.

Further, the resolution of the analog to digital converter is not lower than 8 bits.

Figure 2:
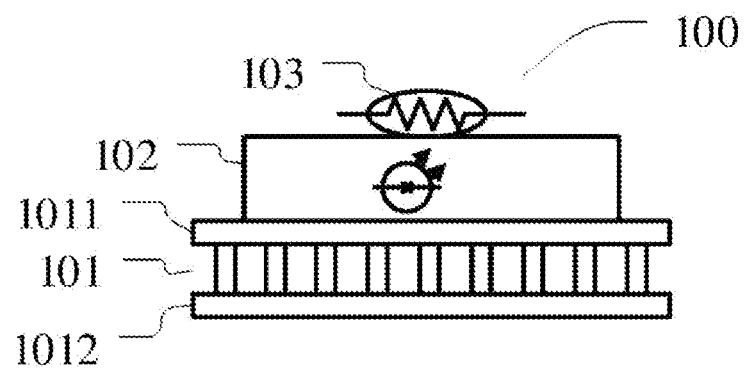
FIG. 2 shows a basic function block diagram of a light emitting assembly according to the present disclosure.

FIG. 2 shows a basic functional block diagram of a light emitting assembly 100 according to the present disclosure, wherein the light emitting assembly 100 includes a TEC assembly 101, a temperature controlled object semiconductor laser 102, and a NTC thermistor 103. To more accurately reflect the actual temperature of the temperature controlled object, the NTC thermistor is located within 20 mm of the temperature controlled object semiconductor laser 102.

Figure 4:
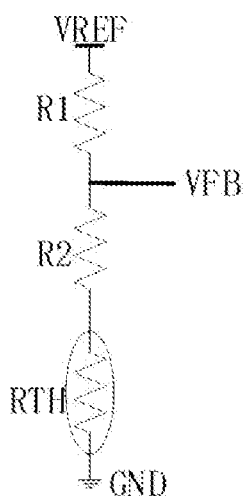
FIG. 4 shows a principle block diagram of a temperature detecting circuit according to the present disclosure.
Figure 5:
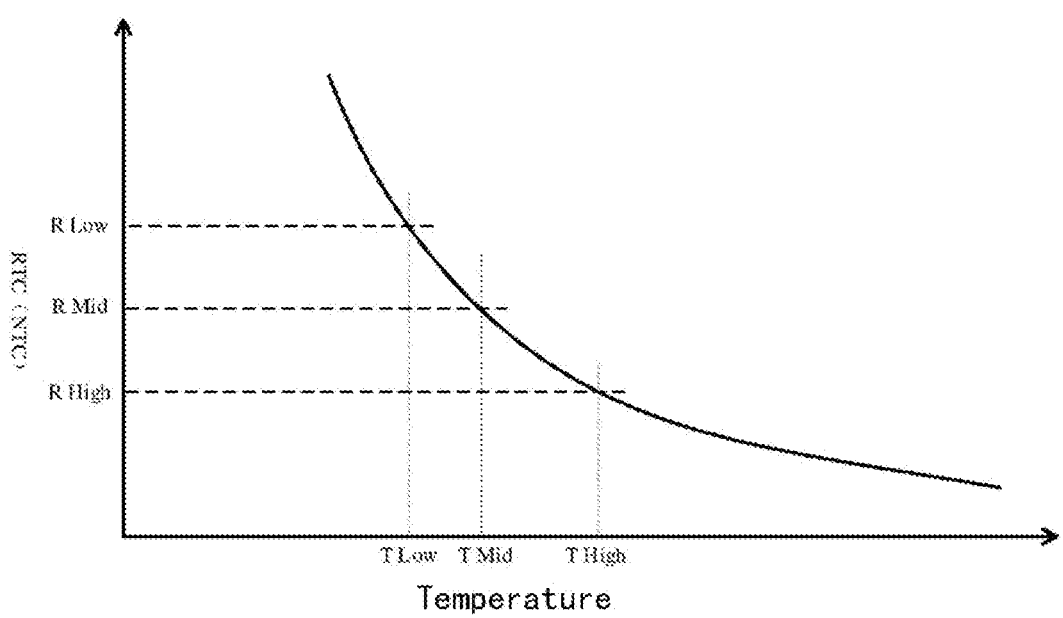
FIG. 5 shows a relation curve of NTC thermistor resistance changing with the temperature according to the present disclosure.
Figure 6:
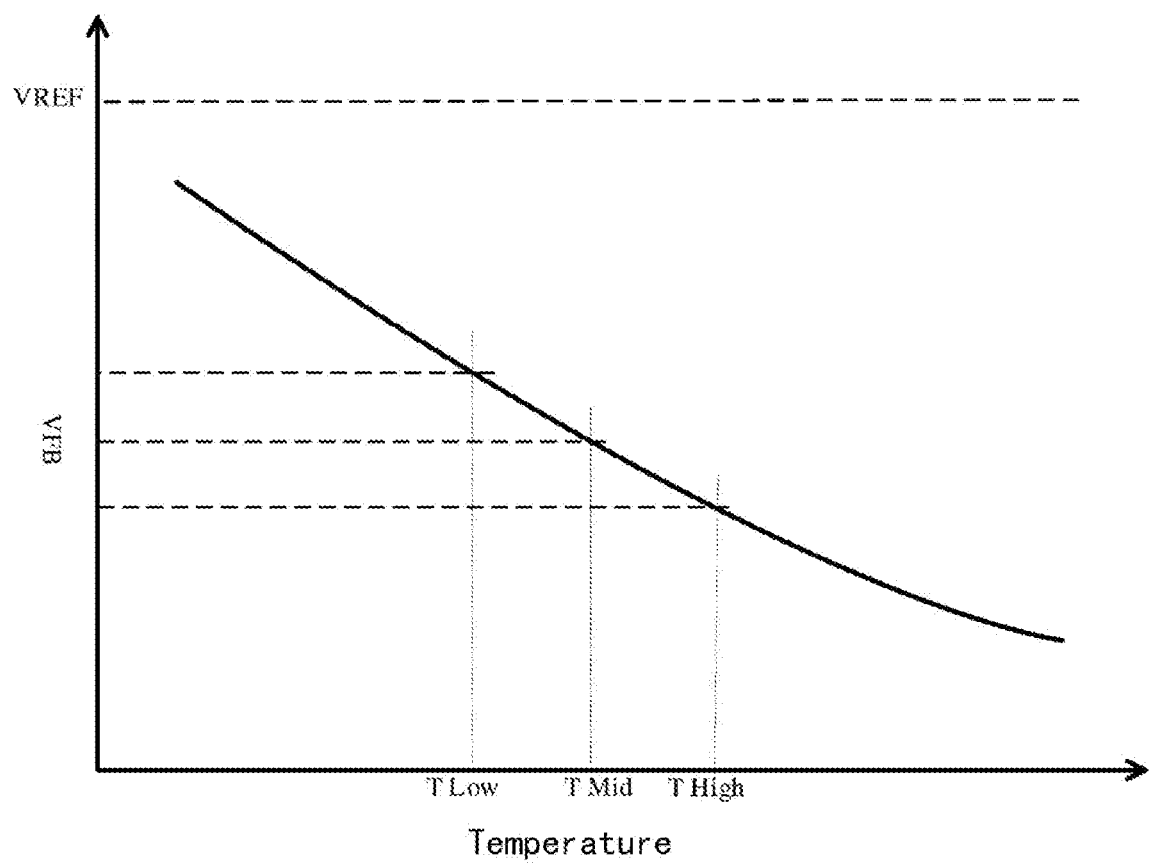
FIG. 6 shows a relation curve of the feedback voltage $V_{FB}$ changing with the temperature shown in FIG. 4 according to the present disclosure.

The resistance value of the negative temperature coefficient (NTC) thermistor 103 changes as the temperature inside the light emitting assembly changes, and is used to provide a feedback of the temperature inside the light emitting assembly, as shown in FIG. 5. The non-linear changing relationship between the resistance and the temperature can be seen from the relation curve showing the thermistor resistance changing with the temperature in FIG. 5. In the present invention, a circuit structure as shown in FIG. 4 is designed to linearize and output the temperature feedback signal $V_{FB}$, by adding a resistance $R_2$ in series with the thermistor, the temperature-voltage transfer function may be linearized with respect to $V_{REF}$, as shown in FIG. 6. The resistance of $R_1$, $R_2$ can be determined specifically by the following method.

$R_{LOW}$ is defined as a resistance value of the thermistor at a temperature of $T_{LOW}$, $R_{MID}$ is a resistance value of the thermistor at a temperature $T_{MID}$, and $R_{HIGH}$ is a resistance value of the thermistor at a temperature $T_{HIGH}$.

$$T_{MID}=(T_{LOW}+T_{HIGH})/2$$

The resistance value of the thermistor at the corresponding temperature can be obtained according to the corresponding thermistor data manual.

The resistance values of $R_1$, $R_2$ is calculated by the following equations:

$$R_2=(R_{LOW}R_{MID}+R_{MID}R_{HIGH}-2R_{LOW}R_{HIGH})/(R_{LOW}+R_{HIGH}-2R_{MID})$$

$$R_1=R_2+R_{MID}$$

$$V_{FB}=V_{REF}\times(R_2+R_{TH})/(R_1+R_2+R_{TH})$$

By adding the resistor $R_2$ in series with the thermistor, the output voltage $V_{FB}$ can linearize, with respect to $V_{REF}$, a temperature-voltage transfer function, and the linearized output voltage $V_{FB}$ can be output as $V_{TEMPOUT}$ through the first amplifier, and determines the operating temperature of the TEC by comparing the set temperature-voltage value $V_{TEMPSET}$ with the temperature-voltage feedback value $V_{TEMPOUT}$.

In FIG. 7, $R_{FB}$ and $V_{TEMPOUT}$ are determined by the following equations:

$$R_{FB}=R_1\times(R_1+R_{LOW}-R_{MID})/(R_{LOW}-R_{MID})$$

$$V_{TEMPOUT}=0.5\times V_{REF}\times R_{FB}\times[1/R_{FB}-1/R_1+1/(R_2+R_{TH})]$$

where $R_{TH}$ is a thermistor value within a setpoint temperature range; $V_{REF}$ is a reference voltage value, including but not limited to 2.5V, 3.3V.

Figure 3:
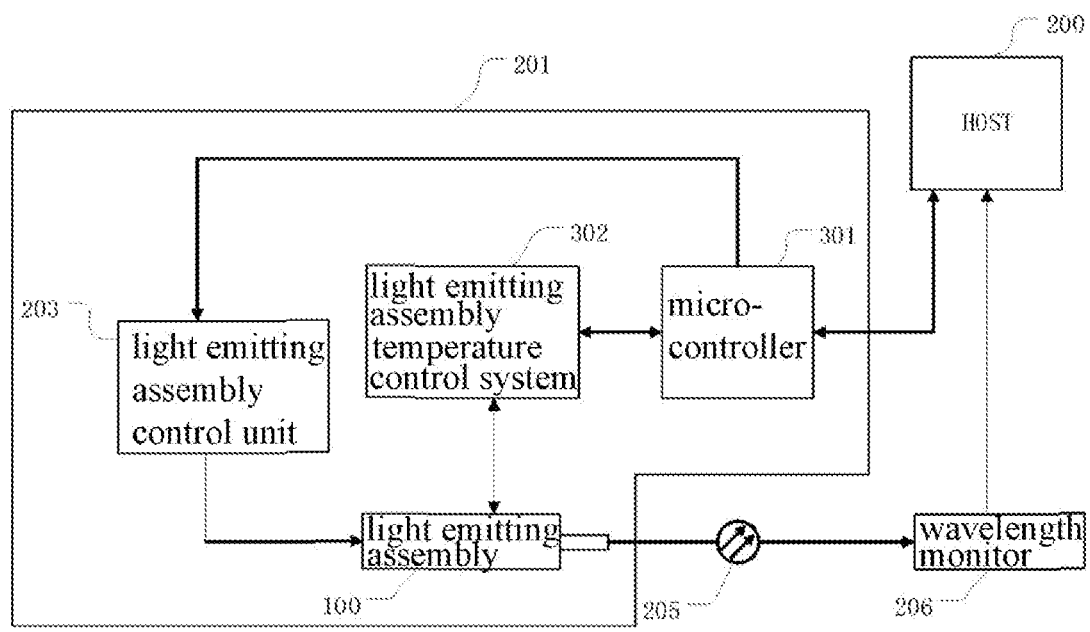
FIG. 3 shows a structural block diagram of a calibration system according to the present disclosure.

Further to determine the data of table corresponding to the non-volatile data stored in the storage unit, the device for controlling a wavelength of a light emitting assembly according to the present disclosure may be accessed to a calibration system, as shown in FIG. 3, which includes a host HOST 200, a unit to be calibrated 201, an optical fiber 205, and a wavelength monitor 206. The unit to be calibrated 201 includes a microcontroller 301, a light emitting assembly temperature control system 302, a light emitting assembly control unit 203, and a light emitting assembly 100. The host HOST 200 is connected to the unit to be calibrated 201 and the wavelength monitor 206. The host HOST 200 issues a calibration command to the microcontroller 301 in the unit to be calibrated 201, and the microcontroller 301 sets the light emitting assembly control unit 203. After set, the set information remain unchanged during calibration, and the light emitting assembly control unit 203 drive the light emitted by the light emitting assembly 100 to enter the wavelength monitor 206 through the optical fiber 205, and the wavelength monitor 206 monitors a central wavelength of the light emitted by the light emitting assembly 100. Meanwhile the microcontroller 301 controls the DAC LSB output voltage in the light emitting assembly temperature control system 302, at the same time, the microcontroller 301 determines whether the temperature is stable by reading sampled data of the $V_{FB}$ temperature feedback ADC sampling channel, and calculating a temperature value according to the sampled data. After the temperature is stable, the host HOST 200 reads the central wavelength data monitored by the wavelength monitor 206, the DAC LSB output voltage value set by the microcontroller 301, and the calculated temperature value according to the sampled data. The host HOST 200 generates a relationship table among the ADC sampling temperature input voltage LSB, the temperature, the central wavelength, and the DAC LSB output voltage by continuously setting and reading the corresponding data relationship. The corresponding table between the resistance value of the NTC thermistor 103 and the temperature is determined according to the parameters of the selected thermistor. The data table generated by the calibration system is written into the storage unit 305 through the external communication interface 314. The microcontroller 301 reads the calibration data table to determine a relevant parameter of the target temperature.

According to the method and device for controlling the wavelength of the light emitting assembly, the control precision and accuracy of the internal temperature of the light emitting assembly are improved, the precise control of wavelength is realized, and the wavelength adjusting function is considered. In addition, the maximum TEC voltage, current limiting function of the device according to the present disclosure can effectively protect the safety of the TEC assembly to avoid being damaged. The TEC voltage, current detection function can effectively detect the working performance of the TEC, and the turn-off enable control function can flexibly turn off the opened TEC control according to the actual state change, therefore the device according to the present disclosure also has strong fault diagnosis and fault protection function.

The various functional units in an embodiment of the invention may be integrated into one processing unit, or every functional unit may be physically present, or two or more units may be integrated into one unit. The above-mentioned integrated units may be realized in the form of hardware, or may be realized in the form of a hardware plus a software functional unit.

It should be noted that the above specific embodiments are only for explaining the technical solutions of the present invention and are not intended to be limiting thereof. Although the present invention has been described in detail with reference to the embodiments, it should be understood by those skilled in the art that the present invention may be modified or replaced with various modifications in the form and details of the present invention without departing from the spirit and scope of the invention.

What is claimed is:

1. A device for controlling a temperature of a light emitting assembly, comprising a microcontroller, a light emitting assembly temperature control unit, an analog-to-digital converter, a digital-to-analog converter, and a storage unit;

wherein the microcontroller includes an ADC input interface connected with the analog-to-digital converter, a DAC output interface connected with the digital-analog converter, an external communication interface, and a memory interface connected with the storage unit;

wherein the light emitting assembly temperature control unit is connected with a thermistor and a thermoelectric cooler both disposed in the light emitting assembly, and the light emitting assembly temperature control unit detects a current temperature of the light emitting assembly by the thermistor, and detects a current voltage/current of the thermoelectric cooler, and inputs the detected current temperature and current voltage/current to the microcontroller through the analog-to-digital converter, receives, by the digital-to-analog converter, a temperature control target set by the microcontroller;

wherein the light emitting assembly temperature control unit achieves a temperature control for the light emitting assembly by calculating and obtaining a voltage/current to be applied to the thermoelectric cooler through a PID control algorithm on the basis of the detected current temperature of the light emitting assembly, the detected current voltage/current of the thermoelectric cooler, and the temperature control target set by the microcontroller, wherein the light emitting assembly temperature controlling unit includes a TEC differential voltage driver, a TEC voltage/current detecting circuit, and a TEC voltage/current limiting circuit;

wherein the TEC differential voltage driver drives the thermoelectric cooler of the light emitting assembly to heat or cool the light emitting assembly; and wherein the TEC voltage/current detecting circuit is connected to the thermoelectric cooler of the light emitting assembly, detects the current voltage/current of the thermoelectric cooler, and inputs the same to the microcontroller through the analog-to-digital converter, and provides feedback to the TEC differential voltage driver through the TEC voltage/current limiting circuit to avoid overloading the thermoelectric cooler.

2. The device for controlling a temperature of a light emitting assembly of claim 1, wherein the light emitting assembly temperature controlling unit includes a temperature detecting circuit, and an error amplification-comparison-compensation unit;

wherein the temperature detecting circuit is connected to the thermistor disposed in the light emitting assembly, and is used to detect a feedback voltage $V_{FB}$ linearly related to the current temperature of the light emitting assembly and to transmit the same to the analog-to-digital converter and the error amplification-comparison-compensation unit;

wherein the error amplification-comparison-compensation unit receives a set voltage $V_{TEMPSET}$ set by the microcontroller, linearly related to the temperature control target, generates an error voltage linearly related to a difference between the feedback voltage $V_{FB}$ and the set voltage $V_{TEMPSET}$, based on the feedback voltage $V_{FB}$ and the set voltage $V_{TEMPSET}$, and outputs the error voltage to the TEC differential voltage driver; and wherein the TEC differential voltage driver, based on the error voltage, outputs a differential driving voltage which drives the thermoelectric cooler of the light emitting assembly.

3. The device for controlling a temperature of a light emitting assembly of claim 2, wherein the error amplification-comparison-compensation unit comprises a first operational amplifier OP1 and a second operational amplifier OP2;

wherein the first operational amplifier OP1 receives the feedback voltage $V_{FB}$ and converts or regulates the same to a linear voltage $V_{TEMPOUT}$ to be output to the second operational amplifier OP2;

wherein the second operational amplifier OP2 establishes a hardware PID compensation network together with separate resistive and capacitive elements, and generates an error voltage that is linear with a difference between the linear voltage $V_{TEMPOUT}$ and the set voltage $V_{TEMPSET}$, based on the linear voltage $V_{TEMPOUT}$ and the set voltage $V_{TEMPSET}$.

4. The device for controlling a temperature of a light emitting assembly of claim 3, wherein the light emitting assembly temperature control unit further includes a turn-off enable control circuit; and the microcontroller is, through a GPIO output interface, connected to the turn-off enable control circuit to control a working state of the TEC differential voltage driver.

5. The device for controlling a temperature of a light emitting assembly according to claim 4, wherein the TEC differential voltage driver operates in a linear power mode, or a switched mode, or a hybrid mode.

6. The device for controlling a temperature of a light emitting assembly according to claim 3, wherein the TEC differential voltage driver operates in a linear power mode, or a switched mode, or a hybrid mode.

7. The device for controlling a temperature of a light emitting assembly of claim 2, wherein the error amplification-comparison-compensation unit generates an error voltage that is linear with the difference between the feedback voltage $V_{FB}$ and the set voltage $V_{TEMPSET}$ through performing a PID operation control by a software.

8. The device for controlling a temperature of a light emitting assembly of claim 7, wherein the light emitting assembly temperature control unit further includes a turn-off enable control circuit; and the microcontroller is, through a GPIO output interface, connected to the turn-off enable control circuit to control a working state of the TEC differential voltage driver.

9. The device for controlling a temperature of a light emitting assembly according to claim 7, wherein the TEC differential voltage driver operates in a linear power mode, or a switched mode, or a hybrid mode.

10. The device for controlling a temperature of a light emitting assembly according to claim 2, wherein the TEC differential voltage driver operates in a linear power mode, or a switched mode, or a hybrid mode.

11. A device for controlling a wavelength of a light emitting assembly, wherein the device for controlling a wavelength of a light emitting assembly comprises the device for controlling a temperature of a light emitting assembly of claim 1, the temperature of the light emitting assembly being controlled by using the device for controlling the temperature of the light emitting assembly, and a central wavelength of an optical signal emitted by the light emitting assembly being controlled.

12. The device for controlling a wavelength of a light emitting assembly of claim 11, wherein the light emitting assembly temperature controlling unit includes a temperature detecting circuit, an error amplification-comparison-compensation unit;
  wherein the temperature detecting circuit is connected to the thermistor disposed in the light emitting assembly, and is used to detect a feedback voltage $V_{FB}$ linearly related to the current temperature of the light emitting assembly and to transmit the same to the analog-to-digital converter and the error amplification-comparison-compensation unit;
  wherein the error amplification-comparison-compensation unit receives a set voltage $V_{TEMPSET}$ set by the microcontroller, linearly related to the temperature control target, generates an error voltage linearly related to a difference between the feedback voltage $V_{FB}$ and the set voltage $V_{TEMPSET}$, based on the feedback voltage $V_{FB}$ and the set voltage $V_{TEMPSET}$, and outputs the error voltage to the TEC differential voltage driver; and
  wherein the TEC differential voltage driver, based on the error voltage, outputs a differential driving voltage which drives the thermoelectric cooler of the light emitting assembly.

13. A method for controlling a wavelength of a light emitting assembly, wherein the method comprises controlling a temperature of the light emitting assembly by the device for controlling the temperature of the light emitting assembly of claim 1, and then performing a PID feedback control to a central wavelength of an optical signal emitted by the light emitting assembly.

14. The method for controlling a wavelength of a light emitting assembly of claim 13, wherein the light emitting assembly temperature controlling unit includes a temperature detecting circuit, an error amplification-comparison-compensation unit;
  wherein the temperature detecting circuit is connected to the thermistor disposed in the light emitting assembly, and is used to detect a feedback voltage $V_{FB}$ linearly related to the current temperature of the light emitting assembly and to transmit the same to the analog-to-digital converter and the error amplification-comparison-compensation unit;
  wherein the error amplification-comparison-compensation unit receives a set voltage $V_{TEMPSET}$ set by the microcontroller, linearly related to the temperature control target, generates an error voltage linearly related to a difference between the feedback voltage $V_{FB}$ and the set voltage $V_{TEMPSET}$, based on the feedback voltage $V_{FB}$ and the set voltage $V_{TEMPSET}$, and outputs the error voltage to the TEC differential voltage driver; and
  wherein the TEC differential voltage driver, based on the error voltage, outputs a differential driving voltage which drives the thermoelectric cooler of the light emitting assembly.

15. A calibration system, wherein comprising a host HOST, a unit to be calibrated, an optical fiber and a wavelength monitor; wherein the unit to be calibrated comprises the device for controlling a temperature of a light emitting assembly according to claim 1, a light emitting assembly control unit, and a light emitting assembly;
  the host HOST is connected with the unit to be calibrated and the wavelength monitor, and the host HOST issues a calibration command to the microcontroller in the unit to be calibrated, and the microcontroller sets the light emitting assembly control unit; and the light emitting assembly control unit drives light emitted by the light emitting assembly to enter the wavelength monitor through the optical fiber, and the wavelength monitor monitors a central wavelength of light emitted by the light emitting assembly.

16. The calibration system according to claim 15, wherein a calibration data table generated by the calibration system is written into the storage unit through an external communication interface of the microcontroller; the microcontroller determines a relevant parameter of a target temperature according to the calibration data table; the calibration data table includes a relationship among an analog-to-digital converter sampling temperature input voltage, a temperature of the light emitting assembly, a central wavelength of the light emitting assembly, and an output voltage output by the digital-to-analog converter.

17. The calibration system according to claim 15, wherein the light emitting assembly temperature controlling unit includes a temperature detecting circuit, an error amplification-comparison-compensation unit;
  wherein the temperature detecting circuit is connected to the thermistor disposed in the light emitting assembly, and is used to detect a feedback voltage $V_{FB}$ linearly related to the current temperature of the light emitting assembly and to transmit the same to the analog-to-digital converter and the error amplification-comparison-compensation unit;
  wherein the error amplification-comparison-compensation unit receives a set voltage $V_{TEMPSET}$ set by the microcontroller, linearly related to the temperature control target, generates an error voltage linearly related to a difference between the feedback voltage $V_{FB}$ and the set voltage $V_{TEMPSET}$, based on the feedback voltage $V_{FB}$ and the set voltage $V_{TEMPSET}$, and outputs the error voltage to the TEC differential voltage driver; and
  wherein the TEC differential voltage driver, based on the error voltage, outputs a differential driving voltage which drives the thermoelectric cooler of the light emitting assembly.

* * * * *